United States Patent
Pace et al.

(10) Patent No.: US 6,232,589 B1
(45) Date of Patent: May 15, 2001

(54) SINGLE POLYSILICON CMOS PIXEL WITH EXTENDED DYNAMIC RANGE

(75) Inventors: Matthew A. Pace, Cortland; Jeffrey J. Zamowski, McGraw, both of NY (US)

(73) Assignee: Photon Vision Systems, Cortland, NY (US)

( * ) Notice: Subject to any disclaimer, the term of this patent is extended or adjusted under 35 U.S.C. 154(b) by 0 days.

(21) Appl. No.: 09/233,310

(22) Filed: Jan. 19, 1999

(51) Int. Cl.$^7$ .......................... H01L 31/00; H01L 27/146
(52) U.S. Cl. .................... 250/208.1; 250/214.1; 257/225; 257/258; 257/292; 257/448; 257/457
(58) Field of Search .................. 250/208.1, 214.1; 257/222, 225, 258, 292, 448, 457

(56) References Cited

U.S. PATENT DOCUMENTS 5,525,813 * 6/1996 Miyake et al. ................ 250/208.1

\* cited by examiner

*Primary Examiner*—F. L. Evans
(74) *Attorney, Agent, or Firm*—Harter, Secrest & Emery LLP; Stephen B. Salai, Esq.; Brian B. Shaw, Esq.

(57) ABSTRACT

A new method of forming a photogate structure called a "Charge Snare Device" (CSD) uses only a single layer of polysilicon where prior art methods used two or more layers for constructing the gate nodes. Typical CCD structures utilize three layers of polysilicon and CID structures utilize two layers of polysilicon and neither of the prior art structures are suitable for standard sub micron processes. The new CSD device allows biasing of the photogate to the full potential that the process will allow for greater full well for a given pixel size and therefore an improved signal to noise ratio. Charge transfer between the collection site and the sense site isn't controlled as in all previous devices, rather the collection site is completely enclosed by the sense site, effectively snaring all collected photon generated charge as it diffuses and drifts to the sense site. The new photogate structure is suitable for passive pixels, Active Pixel Sensors (APS) or Active Column Sensors (ACS).

33 Claims, 4 Drawing Sheets

SINGLE POLYSILICON CMOS PIXEL WITH EXTENDED DYNAMIC RANGE

FIELD OF THE INVENTION

This invention relates generally to solid state imagers and more specifically to CMOS passive, active pixel and active column imagers having, higher performance and lower cost.

BACKGROUND OF THE INVENTION

Passive or active pixel imagers are semiconductor devices capable of converting optical images into electronic signals. Pixels can be arranged in a matrix and utilized to generate video signals for video cameras, still photography, or anywhere incident radiation needs to be quantified. When incident radiation interacts with a photosite, charge carriers are liberated and collected for sensing. The amount of collected carriers in a photosite represents the amount of incident light collected for a given time period.

There are two basic devices with many variants, employed to collect and sense charge carriers in a photosite. These two basic devices are photodiodes and photogates. Variants of photodiode include, but are not limited to: Pinned, P-I-N, Metal-Semiconductor, Heterojunction and Avalanche. Photogate structures include: Charge Coupled Devices (CCD), Charge Injection Devices (CID) and their variants that include virtual phase, buried channel and other variations that utilize selective dopants. The selective dopants are used to control charge collection and transfer underneath and between the photogate(s) and the sense node.

FIG. 1 shows an exemplary prior art CID pixel arrangement with charge transfer electronics. Pixels 8 and 9 could be only two of a very long row of pixels that may contain hundreds or thousands of pixels. A row and column orientation has been given to the schematic contained herein. Depending on application requirements, the row and column orientation may be switched. Referring to FIG. 1, the CID pixel 8 may be described as a collection photogate 10 directly coupled to the sense photogate 12 by overlapping semiconductor layers. The semiconductor material is preferably polysilicon, but may be amorphous silicon, single crystal silicon, or other material. This overlap of the polysilicon layers provides a continuous path to control the flow of photon generated charge. This is accomplished by biasing the collection photogate opposite to the epitaxial layer 20 and similar to the substrate 22. A depleted area 14 is formed in the epitaxy under the collection photogate 10 by means of column bias 28. The sense photogate 12 is biased with half of the potential difference of the collection photogate relative to the epitaxy. As incident photons strike the pixel area and penetrate into the depleted region, they will be collected under the collection photogate site 10 as it has the greatest potential. The amount of charge an individual collection site can hold is dependent on the total capacitance that is due to the total area and the total potential difference between the collection photogate site and the sense photogate site. Therefore, a traditional CID device is limited to half of the total biasing limits allowed for a given silicon process. That is, a 1.2 micron CMOS process may be limited to 5.0 Volts total potential before circuit failure and therefore the maximum potential that can be used is 2.5 Volts for sensing photon generated charge. Either n-type or p-type epitaxial conductivity can be utilized; the difference being that the biasing requirements are similar but reversed in polarity. Reading the charge is accomplished through sense gate 12. The voltage on sense gate 12 forms depleted area 16. The sense gate voltage is amplified by amplifier 18. The amplifier output is thereafter processed further. Clearing the collected charge is accomplished by eliminating the potential bias on both collection and sense photogate sites through a reset gate 24 and reset bias voltage 26 applied through electrode 23 so that the charge held by the potentials is released and swept to the substrate layer 22 where the charge is drained by a fixed potential. Since the substrate layer is vertically below the collection and sense photogates of a CID, there is a direct path that doesn't block any of the photosensitive area. However, CID pixel separation is normally provided by a field oxide or nitride material that is relatively opaque to the shorter wavelengths.

Solid state imagers have been dominated by CCDs because of their low noise as compared to the alternatives such as Photodiodes and CIDs. The low noise advantage of CCD imagers is the result of collecting the photon generated charge at the pixel site and then coupling or shifting the actual charge to an amplifier at the periphery of the device. With a CID or Photodiode, the signal is collected and then sensed from the periphery of the array. The long polysilicon and metal busses degrade the signal with the associated resistance and capacitance. However, the low noise of the CCD causes the imager to be read in a fixed format and, once the charge is read, it is destroyed. The requirement of coupling the collected photon charge from the pixel to the periphery amplifier (a.k.a. Charge Transfer Efficiency), requires proprietary processing steps not compatible with industry standard CMOS or BiCMOS processes.

Solid State imaging devices have developed in parallel with CMOS technology. As a result, imager manufacturers had developed their own proprietary processes to maximize imager performance characteristics and wafer yield. Specialized silicon wafer processing have kept imager prices artificially high. Beginning in the early 90's the move to transfer the proprietary processes to industry standard CMOS processes was on. In both of the traditional photogate technologies, CID and CCD, the ability to collect and transfer the charge from the collection site to the sense site and the subsequent elimination of the collected charge is the fundamental readout sequence required. The original CCD and CID technology originally rely on the overlapping of polysilicon layers to provide a controlled path to transfer charge. Variants of photogates have utilized selective dopants to control the collection and transfer process. Modern submicron CMOS processes have no or very limited ability to provide a second polysilicon layer to control charge transfer.

A need exists for a pixel that can be utilized in an imaging device that doesn't require any extra implants or a second layer of polysilicon and is able to utilize the full biasing potential of submicron processes. A pixel designed without extra implants or a second polysilicon layer, will improve wafer yields due to decreased complexity, lower wafer processing costs, and improved pixel sensitivity, by eliminating double layers of polysilicon and/or implants that may block a photon's capture. Also, since submicron process have reduced operating biases, the total amount of charge that can be collected is also reduced. Smaller scale technology have heightened the need for a pixel that is able to utilize the full biasing potential of the process.

SUMMARY OF THE INVENTION

The present invention relates to a charge snare device, comprising a substrate and a plurality of pixels on the substrate, each pixel comprising a sense gate; and a charge collection gate, the charge collection gate at least substantially surrounding the sense gate.

An object of the present invention is to permit biasing to technology limits. A photogate pixel structure, herein known as Charge Snare Device (CSD), utilizes only one polysilicon layer by substantially or, preferably, completely enclosing the collection site with the sense site. By completely enclosing the collection site with the sense site, a new method is formed to transfer the photon generated charge. The transfer is accomplished by the close proximity of the depletion regions between the two sites and a complete lateral block for the charge to transfer to adjacent pixels, rather than provide the controlled path for charge to transfer of the prior art. Because there are no overlapping silicon layers, this new pixel also allows biasing to the limits of the process in which the sensor is fabricated for creating a greater full well. The collected charge is cleared from the site by a lateral drain formed with an implanted region biased opposite to the substrate and when both polysilicon sites in the pixel are biased to the same potential as the substrate. This photogate structure can be used with passive pixel sensor, an Active Pixel Sensor or an Active Column Sensor. A description of an Active Column Sensor is found in U.S. Ser. No. 09/039,835, now U.S. Pat. No. 6,084,229 entitled Active Column Sensor, hereby incorporated by reference.

DETAILED DESCRIPTION OF THE PREFERRED EMBODIMENT

The present invention relates to CMOS imager devices. In the present invention, a pixel's collection site is substantially surrounded by the pixel's sense site in which there is no overlap of the silicon layers pertaining to each of the CID sites. Optionally, a lateral drain is provided to ensure charge does not migrate between pixels.

Figure 1:
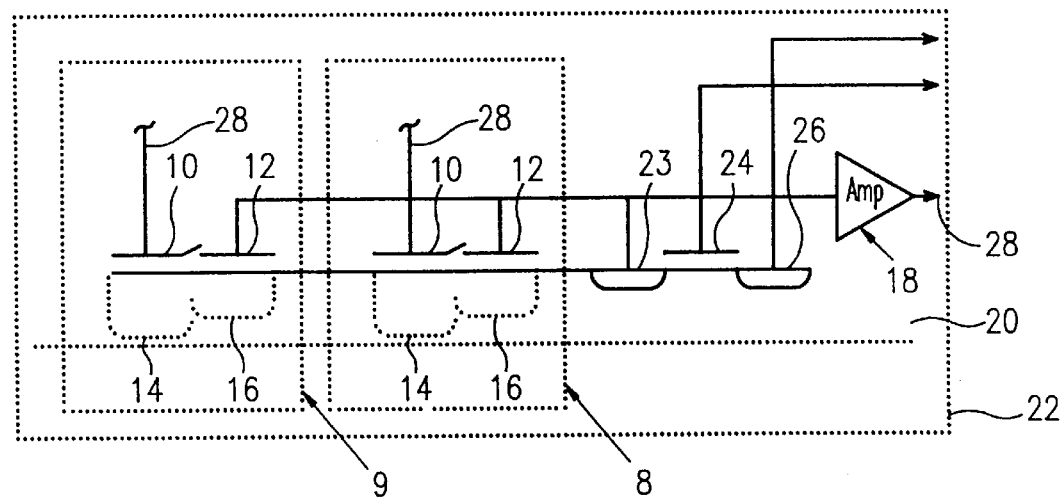
FIG. 1 is a prior art double polysilicon CID pixel cross-sectional diagram.
Figure 2:
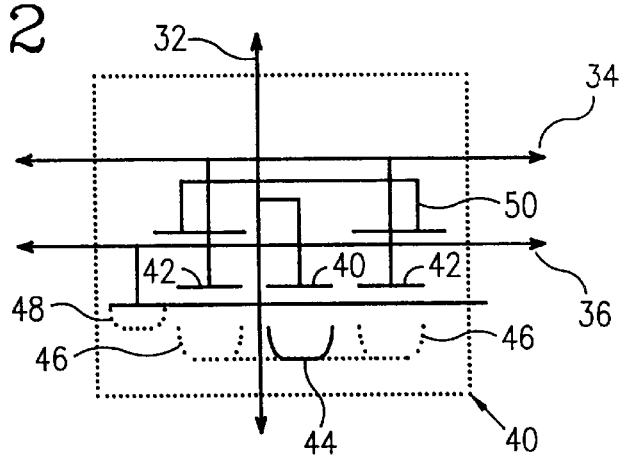
FIG. 2 is a cross-sectional diagram of invention as a passive pixel.

An embodiment of the invention is shown in a cross sectional manner of FIG. 2 where the collection photogate 40 is centered and surrounded by the sense gate 42. Both gates are made of the same layer of polysilicon or similar CMOS compatible material. Photon generated charge is collected by depleting the substrate 44 beneath collection photogate 40 by applying the proper bias to the photogate through column bias buss 32. After the appropriate integration time, the sense photogate 42 through row or sense bias buss 34 is biased up to the limits of the process forming a depleted region 46. Then the bias on the collection photogate 40 is removed and the collected photon generated charge diffuses and drifts, due to the potential of the sense photogate, to the depleted area 46 under the sense photogate 42. Now the pixel can have both the collection and sense photogates biased to the limits that the process will allow, effectively doubling the amount of charge that can be stored under a given area of polysilicon. Since, Q=CV; where, Q is charge and C is capacitance and V is Volts, and the potential applied to the sense photogate is doubled, and can now hold twice as much charge. The result is the full well or saturation of the pixel is doubled, for the same physical surface area, which increases the dynamic range by a factor of two, or 3 db, for a doubling of the Signal to Noise ratio (S/N) for overall improved performance. A doubling of the sense biasing is possible because there isn't a direct path for charge to transfer between photogates as in prior art. Charge removal is accomplished by biasing lateral drain 48 by the drain bias buss 36.

Figure 3:
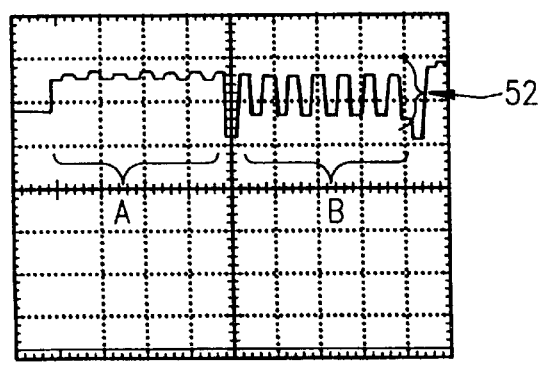
FIG. 3 is actual data from an oscilloscope showing the elimination of fixed pattern noise (FPN).

The overlap of polysilicon layers in CID devices is a source of Fixed Pattern Noise (FPN) as the overlap is a source of capacitance that is shared between the two photogates. FIG. 3 illustrates how the shared capacitance of a two polysilicon pixel results in FPN and is effectively eliminated in the group of single polysilicon "charge snare" pixels according to this invention. FIG. 3 shows an oscilloscope trace of actual video from an active column sensor (ASC) at dark of a group of single polysilicon pixels in a group of two poly pixels showing the elimination of fixed pattern noise due to no polysilicon overlap. The signal deviation 52 for a group of single poly pixels A and a group of two poly pixels B is graphed in FIG. 2. The smaller the signal deviation, the better. Each pixel is first sensed prior to transfer of charge and then immediately remeasured after charge has been transferred. This measurement was taken at dark in room temperature; therefore, the only signal is the accumulated dark current. The smaller the deviation, the less the FPN. The shared capacitance between the two polysilicon photosites within the pixel formed by the overlapped polysilicon layers causes in effect a false video signal. The overall amount of false signal is easily correctable by subtracting this fixed offset. However, the uncorrectable part of FPN is due to the deviations of the overlapped capacitance due to process variations due to oxide thickness, polysilicon grain size and etching variations in forming the photogates. The more overlap capacitance, the greater the potential for overlap capacitance variations. In this invention, since the shared capacitance is eliminated by eliminating the overlap, all FPN due to the shared capacitance is eliminated. Since the overlap of polysilicon is eliminated, the area normally used to couple the charge is eliminated, thus directly exposing the silicon to the shorter wavelengths of light without these wavelengths being absorbed by an insulating layer. The lateral drain 48 of FIG. 2 does consume some of the surface area that could be used to gather photon generated charge. This minor tradeoff is far outweighed by the improvements. Also, pixel isolation between pixels can be accomplished via the lateral drain instead of field oxide normally used in prior art CIDs. Another tradeoff of having to capture or "snare" the charge by the sense site is lowered Charge Transfer Efficiency (CTE). Since, there isn't a direct path of controlled charge transfer, the collected charge is initially free to recombine prior to capture.

The invention of FIG. 2 allows for electronic shuttering of the signal. Electronic shuttering can be accomplished by covering the sense site with metal or similarly compatible layer 50 of a CMOS process to effectively block light from the sense site. When the charge is transferred to the sense site, only the collection site is exposed to incident light. If the collection photogate is then depleted, the photon generated charge subsequent to the transfer, will be collected at the collection photogate due to the proximity of the photon generated charge to the collection photogate. After sensing the charge in the sense site is complete, both the collection and sense sites can be cleared prior to the next integration period.

Figure 4:
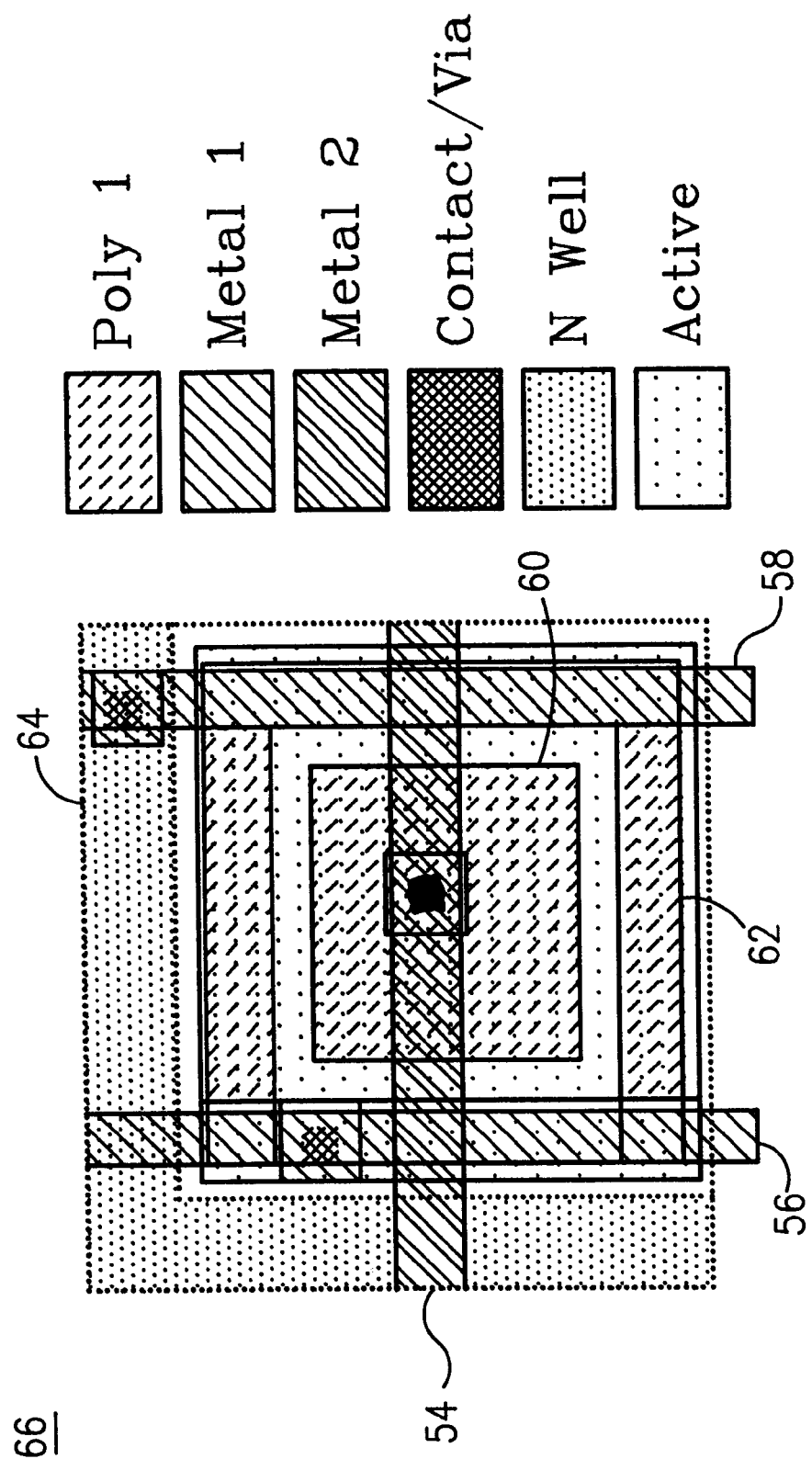
FIG. 4 is a top down view of invention layout for a passive pixel.

A top view of an example of a very simple layout for a passive "Charge Snare Device (CSD)" single polysilicon photogate 66 is shown in FIG. 4. The charge collection site 60 is centered within the charge sense site 62. Not shown for clarity is the optional metal opaque shutter over and conforming to the shape of the charge sense site since it is undesirable to generate photons in this site. The lateral drain 58 could be routed on either axis. Collection bias buss 54 and sense bias buss 56 gather charge for the read out circuitry. Lateral drain 64 controlled by VDD/N-Well 58 helps retain charge within the pixel. The charge sense and collection sites could be routed on either axis as well and would be routed as the application required. This example pixel is simplistic and may take on different shapes as the application requires.

Figure 5:
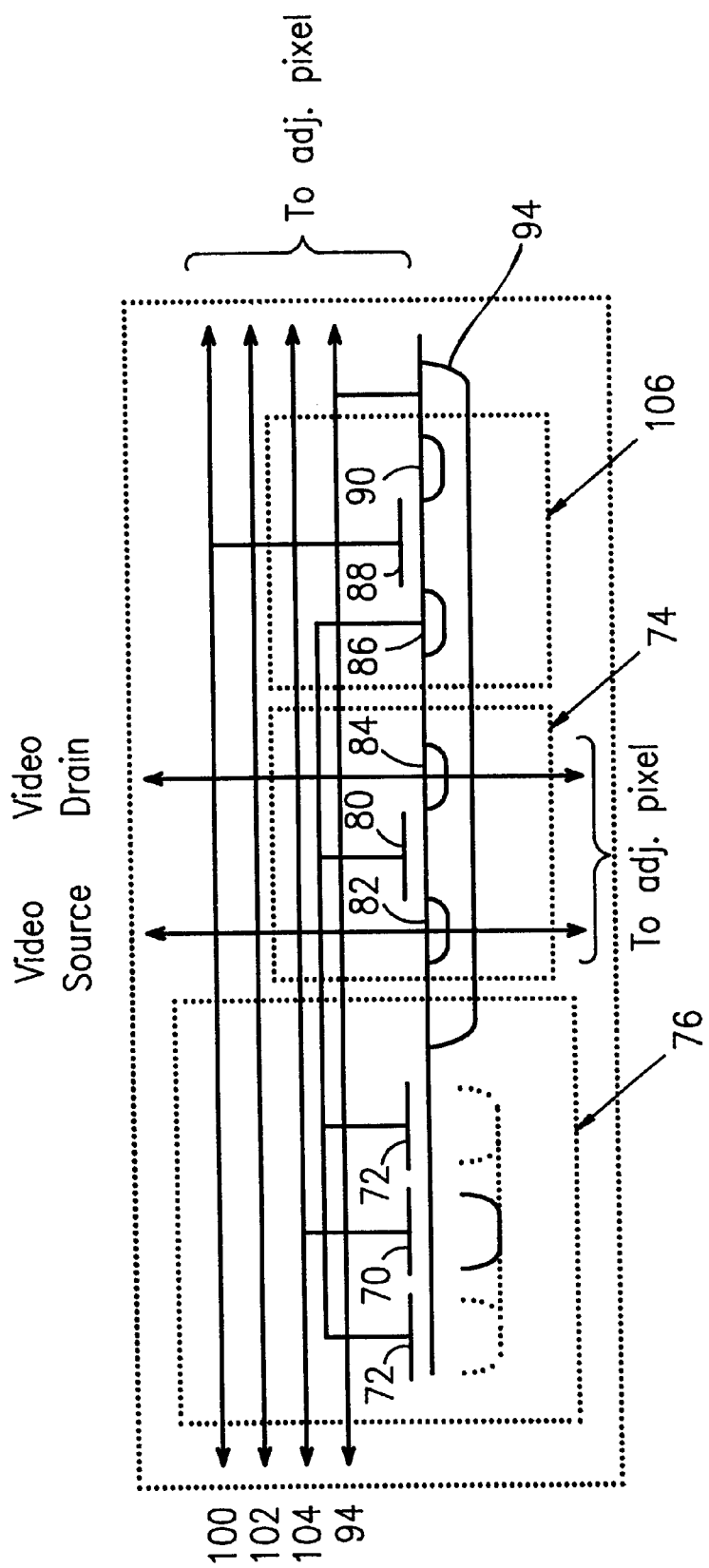
FIG. 5 is a cross-sectional diagram of invention as an active column pixel.
Figure 6:
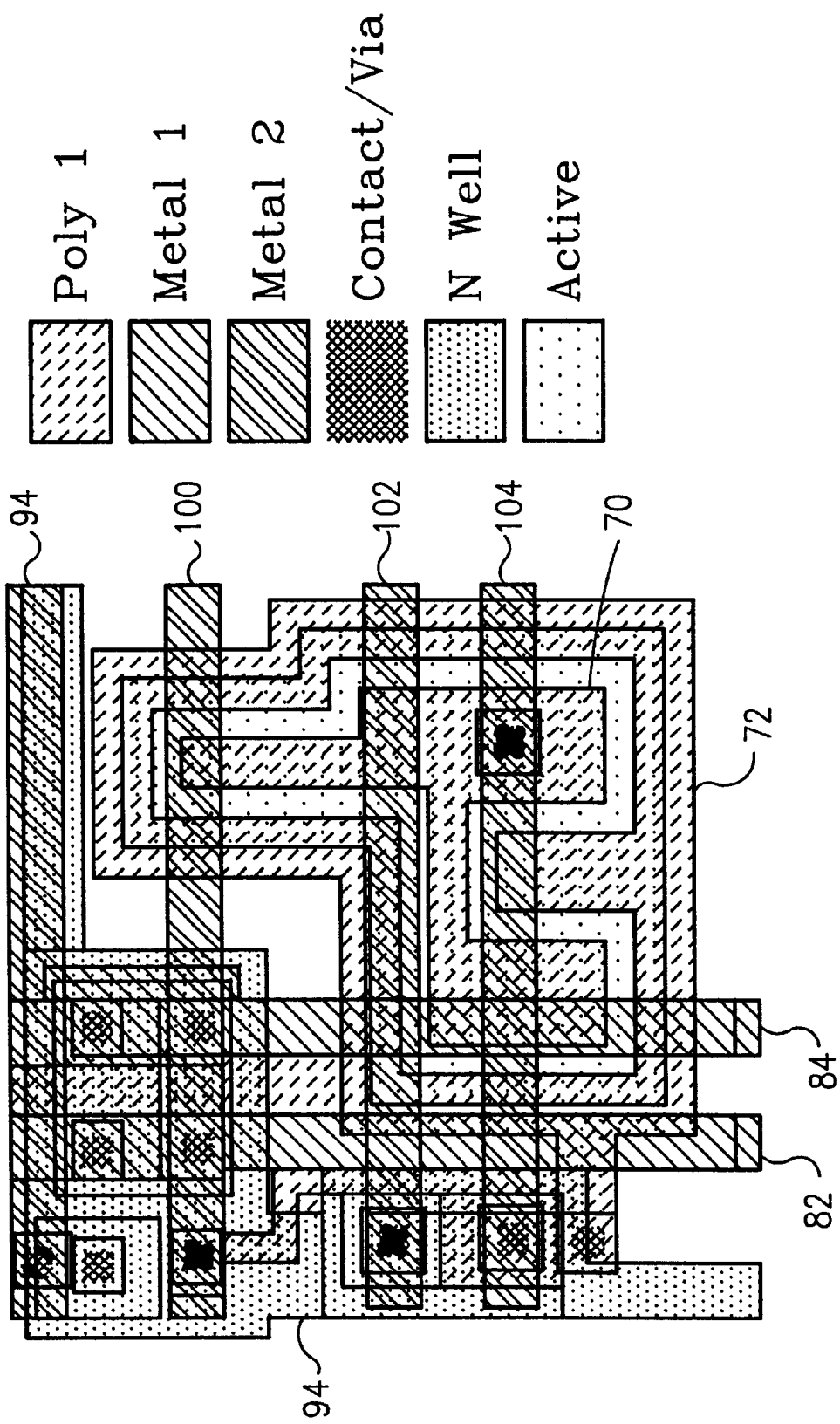
FIG. 6 is a top down view of invention layout for an active column pixel.

An active column sensor (ACS) polysilicon pixel is shown by the cross section of the pixel and accompanying schematic in FIG. 5 and the top view layout of FIG. 6. Here an ACS uses the new CSD pixel. Each pixel is composed of the collection site 70 and sense site 72 that is controlled and buffered by FETs 106 and 74 respectively. Operation of the ACS sensor employing a CSD 76 is as follows. The collection site 70 is depleted (5.0 V) via the collection bias buss 104, for a desired integration period and exposed to light. After the integration period has elapsed, the sense site 72 is depleted by operation of FET 106. The FET 106 is turned on through the Row Selection buss 100 is activation of gate 88. P-FETs are illustrated in this example, however, N-FETs could be employed as well. For this example, the substrate is biased to 0.0 V with VDD and NWell 94 biased to 5.0V. The gate 88 of FET 106 is biased to 0.0 V to turn FET 106 on and the sense site is biased to 5.0V by source 90 through the sense bias buss 102 and depleted. The gate 86 is directly connected to the sense site 72. The gate 88 of FET 106 is turned off isolating the sense site. By biasing the Sense site the video FET 74 is turned on. The collection site 70 is cleared of charge by biasing it to the same potential as the substrate (0.0 V). The collected photon generated charged is collected or snared by the sense site. The collected charge in the sense site modulates the gate 80 of FET 74 and is representative of the amount of collected charge. FET 74 is the input FET of a differential pair that is used to form an amplifier. Drain 84 and source 82 of FET 74 provide video signals. The remainder of the amplifier is placed at the end of the column of pixels. All the attributes of the ACS remain intact. Note how the N-Well is utilized as the lateral drain to collect discarded photon generated charge and isolate pixels from each other. Each column would have its own amplifier. An actual layout of FIG. 5 of an ACS pixel with the invention is shown in FIG. 6.

Variations and modifications in the design that are within the scope of the invention will undoubtedly suggest themselves to those skilled in the art. Accordingly, the foregoing description should be taken as illustrative and not in a limiting sense.

What is claimed is:

1. A charge snare device, comprising:
    a substrate; and
    a plurality of pixels on the substrate, each pixel comprising a charge collection gate; and
    a sense gate, the sense gate at least substantially surrounding the charge collection gate.

2. The charge snare device of claim 1, the sense gate totally surrounding the charge collection gate.

3. The charge snare device of claim 1, each pixel further comprising a lateral drain, the lateral drain providing a complete lateral block preventing charge transfer between pixels.

4. The charge snare device of claim 1, the sense gate and charge collection gate having a spaced apart, non-overlapping relationship.

5. The charge snare device of claim 1, further comprising a light blocking layer for each pixel, the light blocking layer being formed to block light to the sense gate.

6. The charge snare device of claim 1, wherein the sense gate and the charge collection gate are formed from a single layer of material.

7. The charge snare device of claim 6, wherein the single layer of material is a layer of CMOS compatible material.

8. The charge snare device of claim 7, wherein the single layer of material is polysilicon.

9. The charge snare device of claim 5, wherein the light blocking layer is formed of metal.

10. The charge snare device of claim 1, wherein the charge collection gate and the sense gate each can be biased to the limits imposed by the material from which each is formed.

11. The charge snare device of claim 1, wherein each of the plurality of pixels is a passive pixel sensor.

12. The charge snare device of claim 1, wherein each of the plurality of pixels is an active pixel sensor.

13. The charge snare device of claim 1, wherein each of the plurality of pixels is an active column sensor.

14. The charge snare device of claim 3, wherein the lateral drain is an N-well in which control FETs are formed.

15. A imager array, comprising:
    a semiconductor substrate; and a
    a matrix of pixels formed in the semiconductor substrate, each pixel having a first portion for generating charge upon stimulation by radiant energy second portion for sensing the charge, and a third portion for reading and erasing the charge, wherein the second portion is formed on the surface of the semiconductor substrate so as to totally surround the first portion.

16. The imager array of claim 15, wherein the third portion comprises an N-well.

17. The imager array of claim 16, wherein a video FET and a bias FET are formed in the N-well.

18. The imager array of claim 17, wherein the gate of the bias FET is driven by a row selection signal, one of the source and drain of the bias FET is driven by a sense bias signal, and the other of the source and drain of the bias FET is tied to the charge sensing second portion.

19. The imager array of claim 18, wherein the shape of the first portion is neither circular nor rectangular.

20. The imager array of claim 16, wherein the N-well of each pixel acts as a lateral drain by preventing the charge from spreading to other pixels.

21. The imager array of claim 15, wherein the charge held by the charge sensing second portion is cleared by biasing the second portion to the same potential as the substrate.

22. The imager array of claim 21, wherein the potential is zero volts.

23. A pixel for an imager, comprising
    a charge collection gate formed in a semiconductor substrate; and
    a sense gate formed in the semiconductor substrate and substantially surrounding the charge collection gate.

24. The pixel of claim 23, the sense gate totally surrounds the charge collection gate.

25. The pixel of claim 23, further comprising a lateral drain, the lateral drain providing a complete lateral block to charge transfer outside the pixel.

26. The pixel of claim 23, the sense gate and charge collection gate formed so as to have a spaced-apart non-overlapping relationship with respect to the planar extension of the semiconductor substrate.

27. The pixel of claim 23, further comprising a light blocking layer formed to block light to the sense gate.

28. The pixel of claim 23, wherein the sense gate and the charge collection gate are formed from a single layer of material.

29. The pixel of claim 28, wherein the single layer of material is a layer of CMOS compatible material.

30. The pixel of claim 29, wherein the single layer of material is polysilicon.

31. The pixel of claim 27, wherein the light blocking layer is formed of a metal.

32. The pixel of claim 25, wherein the lateral drain is an N-well into which control FETs are formed.

33. The pixel of claim 29, wherein the pixel is one of a matrix of identical pixels formed in the semiconductor substrate of an imager array.

* * * * *

UNITED STATES PATENT AND TRADEMARK OFFICE
CERTIFICATE OF CORRECTION

PATENT NO.     : 6,232,589 B1
DATED          : May 15, 2001
INVENTOR(S)    : Matthew A. Pace and Jeffrey Zarnowski It is certified that error appears in the above-identified patent and that said Letters Patent is hereby corrected as shown below:

[75] Inventors: Matthew A. Pace, Cortland; Jeffrey J. Zarnowski, McGraw, both of NY (US)

Signed and Sealed this

Fourth Day of September, 2001

*Attest:*

NICHOLAS P. GODICI
*Attesting Officer*   *Acting Director of the United States Patent and Trademark Office*